United States Patent
West et al.

(10) Patent No.: US 9,653,820 B1
(45) Date of Patent: May 16, 2017

(54) ACTIVE MANIFOLD SYSTEM AND METHOD FOR AN ARRAY ANTENNA

(71) Applicants: James B. West, Cedar Rapids, IA (US); Michael L. Hageman, Mount Vernon, IA (US); Russell D. Wyse, Center Point, IA (US)

(72) Inventors: James B. West, Cedar Rapids, IA (US); Michael L. Hageman, Mount Vernon, IA (US); Russell D. Wyse, Center Point, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 233 days.

(21) Appl. No.: 14/300,074

(22) Filed: Jun. 9, 2014

(51) Int. Cl.
| *H01Q 13/10* | (2006.01) |
| *H01Q 21/00* | (2006.01) |
| *H01Q 21/24* | (2006.01) |
| *H03H 7/46* | (2006.01) |

(52) U.S. Cl.
CPC ......... *H01Q 21/24* (2013.01); *H01Q 21/0006* (2013.01); *H01Q 21/0087* (2013.01); *H03H 7/468* (2013.01)

(58) Field of Classification Search
CPC . H01Q 21/24; H01Q 21/0006; H01Q 21/0087
USPC .......................... 343/754, 767, 770
See application file for complete search history.

(56) References Cited

U.S. PATENT DOCUMENTS

| 4,870,374 A | 9/1989 | Harris |
| 5,013,979 A | 5/1991 | Birleson |
| 5,414,433 A | 5/1995 | Chang |
| 5,592,179 A | 1/1997 | Windyka |
| 5,721,556 A | 2/1998 | Goutzoulis |
| 5,873,026 A | 2/1999 | Reames |
| 6,081,241 A * | 6/2000 | Josefsson ............... H01P 5/107 333/26 |
| 6,133,868 A | 10/2000 | Butler et al. |
| 6,191,735 B1 | 2/2001 | Schineller |
| 6,413,896 B1 * | 7/2002 | Shimada ............... C04B 35/453 257/E21.272 |

(Continued)

FOREIGN PATENT DOCUMENTS

WO  WO-2007/023371 A1  3/2007

OTHER PUBLICATIONS

U.S. Appl. No. 13/714,209, filed Dec. 13, 2012, Wyse et al.

(Continued)

*Primary Examiner* — Dameon E Levi
*Assistant Examiner* — David Lotter
(74) *Attorney, Agent, or Firm* — Donna P. Suchy; Daniel M. Barbieri

(57) ABSTRACT

A system and method uses an active manifold for an antenna array. The manifold can be assembled by a method including providing a first set of cards including a first set of antenna elements and a corresponding number of integrated circuit based time delay units or phase shifters for the first set of antenna elements. The first set of antenna elements is associated with a row of the antenna array. The method also includes providing a second set of cards including a second set of antenna elements and a corresponding number of integrated circuit based time delay units or phase shifters for the second set of antenna elements. The second set of antenna elements is associated with a column of the antenna array.

20 Claims, 6 Drawing Sheets

(56) References Cited

U.S. PATENT DOCUMENTS

| | | | |
|---|---|---|---|
| 6,989,788 | B2 | 1/2006 | Marion et al. |
| 7,808,798 | B2 | 10/2010 | Cotte et al. |
| 8,466,846 | B1 | 6/2013 | Elsallal et al. |
| 8,659,499 | B1 * | 2/2014 | Pluymers ............ H01Q 21/0087 |
| | | | 343/879 |
| 9,083,350 | B1 | 7/2015 | Posner et al. |
| 2002/0093453 | A1 | 7/2002 | Vail et al. |
| 2003/0189515 | A1 * | 10/2003 | Jacomb-Hood ........ H01Q 1/288 |
| | | | 342/373 |
| 2005/0270219 | A1 | 12/2005 | Dwelly et al. |
| 2005/0275585 | A1 | 12/2005 | Shima et al. |
| 2006/0068707 | A1 | 3/2006 | Greeley |
| 2006/0164284 | A1 * | 7/2006 | Pauplis ................. G01S 7/2813 |
| | | | 342/16 |
| 2009/0231197 | A1 | 9/2009 | Richards |
| 2009/0251368 | A1 | 10/2009 | McCune, Jr. |
| 2010/0117917 | A1 * | 5/2010 | Kindt ..................... H01Q 13/08 |
| | | | 343/843 |
| 2010/0259446 | A1 | 10/2010 | Corman et al. |
| 2011/0109507 | A1 * | 5/2011 | Warnick ............. H01Q 21/0025 |
| | | | 342/368 |
| 2011/0299456 | A1 | 12/2011 | Schmidt et al. |
| 2011/0305258 | A1 | 12/2011 | Boutchich et al. |
| 2012/0326781 | A1 | 12/2012 | Mori et al. |
| 2013/0235962 | A1 | 9/2013 | O'Keefe et al. |

OTHER PUBLICATIONS

U.S. Appl. No. 13/737,777, filed Jan. 9, 2013, Wyse et al.
U.S. Appl. No. 13/760,964, filed Feb. 6, 2013, Finley et al.
U.S. Appl. No. 13/781,449, filed Feb. 28, 2013, West et al.
U.S. Appl. No. 13/837,934, filed Mar. 15, 2013, West et al.
U.S. Appl. No. 14/300,021, filed Jun. 9, 2014, West et al.
U.S. Appl. No. 14/300,055, filed Jun. 9, 2014, West et al.
Non-Final Office Action on U.S. Appl. No. 14/849,491, mail date May 24, 2016, 11 pages.
U.S. Appl. No. 14/788,360, filed Jun. 30, 2015, Hageman et al.
Carchon et al. "Thin Film Technologies for Millimeter-Wave Passives and Antenna Integration" imec EuMW 2008 38th European Microwave Conference, pp. 1-46.
Final Office Action on U.S. Appl. No. 14/849,491, dated Oct. 21, 2016, 5 pages.
Non-Final Office Action on U.S. Appl. No. 14/300,055, dated Sep. 27, 2016, 7 pages.
Kraus, J.D. et al., Antennas for All Applications, Third Edition, McGraw-Hill Higher Education, p. 109, 2002.
Molisch, A.F. et al., Time Hopping and Frequency Hopping in Ultrawideband Systems, IEEE Pacific Rim Conference on Communications, Computers and Signal Processing, p. 541-544, 2003.
Non-Final Office Action on U.S. Appl. No. 14/300,021, dated Mar. 21, 2017, 19 pages.
Non-Final Office Action on U.S. Appl. No. 14/788,360, dated Feb. 24, 2017, 26 pages.

* cited by examiner

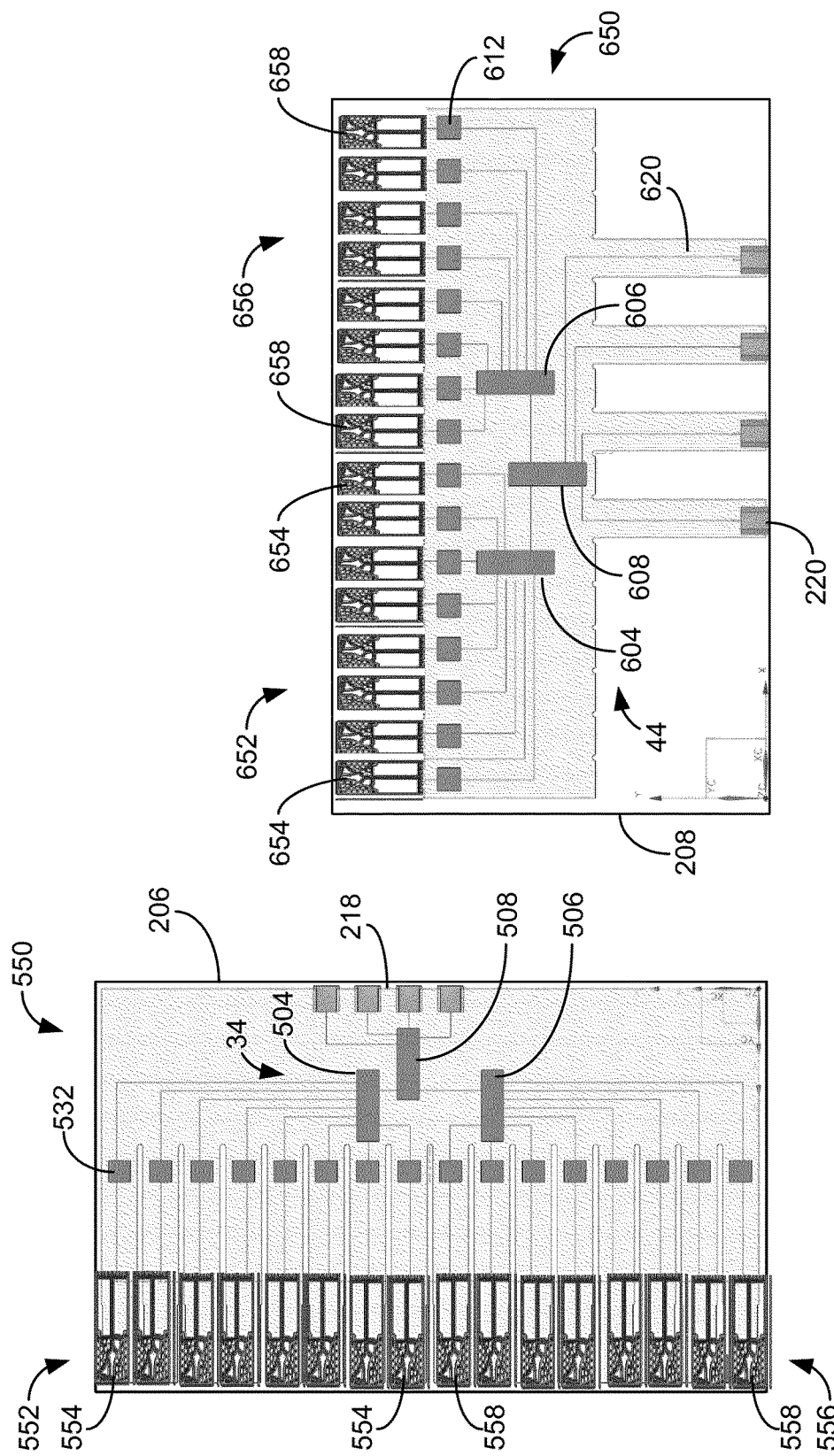

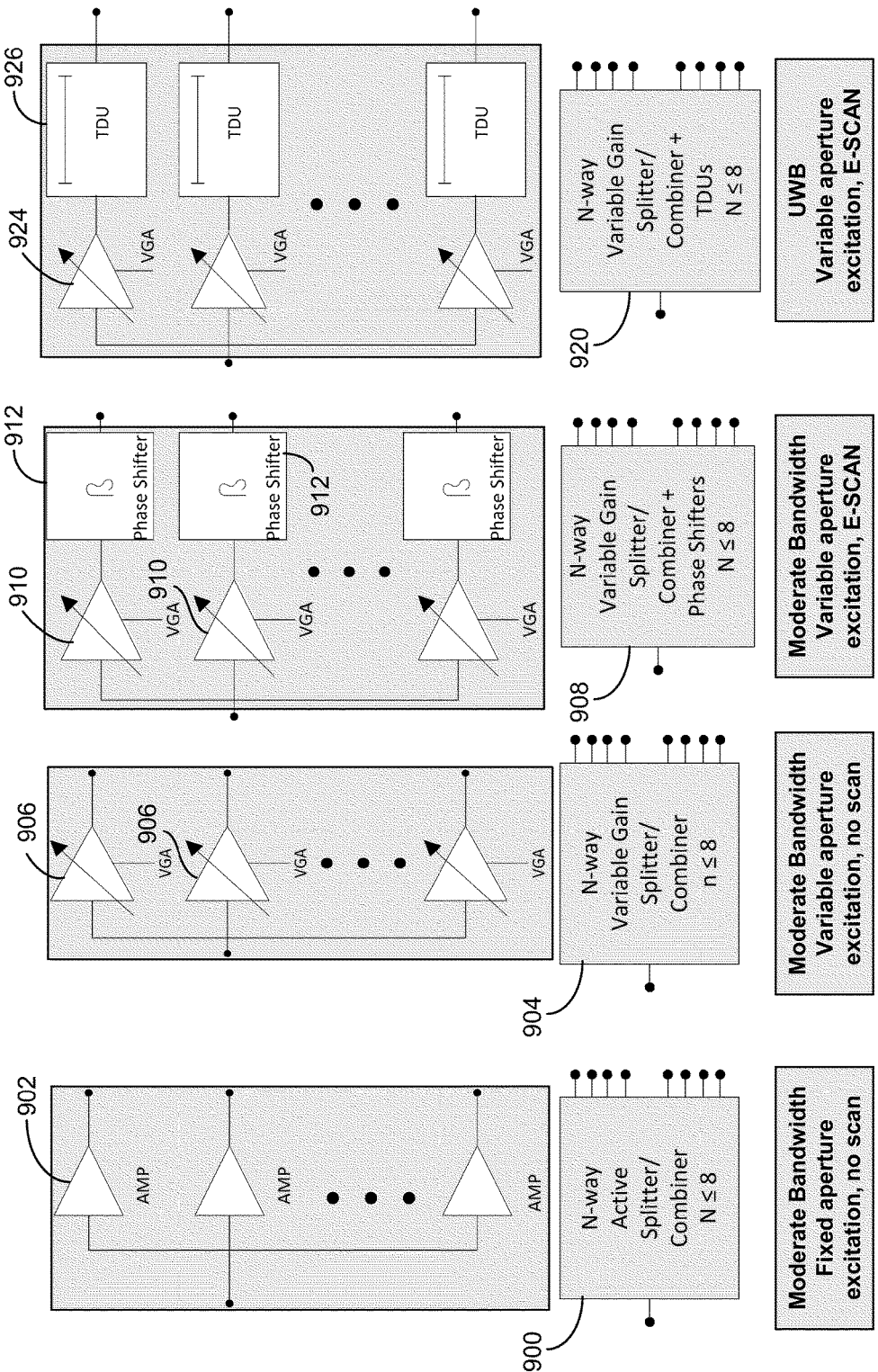

ACTIVE MANIFOLD SYSTEM AND METHOD FOR AN ARRAY ANTENNA

CROSS-REFERENCE TO RELATED PATENT APPLICATIONS

This application is related to U.S. application Ser. No. 14/300,021, filed on an even data be West et al. herewith, and entitled "Synchronously Tuned Phase Shifter System and Method for an Array Antenna," and U.S. application Ser. No. 14/300,055, filed on an even date herewith by West el., and entitled "Integrated Time Delay Unit System and Method for a Feed Manifold,", both assigned to the Assignee of the present application and hereby incorporated by reference in their entireties.

BACKGROUND

The present disclosure relates generally to the field of antenna systems. More specifically, the present disclosure relates generally to the field of feed manifolds for antenna arrays, including but not limited to, phased array antenna systems or electronically scanned array (ESA) antenna systems, such as active electronically scanned array (AESA) antenna systems.

Antenna arrays are utilized with transceivers. As used in this application, the term transceiver refers to an electronic device embodied as a transmitter, a receiver or a transmitter/receiver. The antenna array can be electronically steered by using variable phase shifters or time delay units coupled to respective antenna elements in the antenna array to direct the antenna at a pointing angle. The antenna array is coupled to the transceiver through an interface that includes the phase shifters or time delay units as well as components, such as, apertures, power amplifiers, low noise amplifiers, transmit/receive switches, temperature sensing equipment, combiners, connectors etc. For example, an antenna array of 16×32 dual polarization (DLP) antenna elements operating in the ultra-wide band (UWB) with four channels uses an interface or feed manifold including 128 columnar beam former networks, four 64 way row beam former networks, and a large, passive modified Wilkinson combiner. The columnar beam former networks and row beam former networks include large passive elements such as passive combiners and time delay units. Such a configuration requires significant volume (particularly in the direction of the depth of the aperture), as well as increased complexity and cost. In addition, the components on each card significantly add to the DC power budget associated with the cards and complicate thermal management issues.

Thus, there is a need for an antenna system which includes a feed manifold of reduced size. Further, there is a need for a reduced size feed manifold that does not include large, high isolation Wilkinson or reactive-tee passive splitters/combiners. Further still, there is a need for an active manifold architecture which is smaller, lighter and requires less power. Further still, there is a need for a method of providing an active radio frequency integrated circuit-based manifold. Yet further, there is a need for a system and method that does not require an independent feed manifold for each channel. Yet further still, there is a need for a UWB transceiver and antenna architecture which is smaller, lighter, and less expensive and uses less power. Further still, there is a need for a feed manifold for an aperture that has a reduced depth dimension. There is a further need for a miniature N-way feed manifold. There is a further need to integrate phase shifters or time delay units on an RFIC for one dimensional or two dimensional AESA beam scanning.

It would be desirable to provide a system and/or method that provides one or more of these or other advantageous features. Other features and advantages will be made apparent from the present specification. The teachings disclosed extend to those embodiments that fall within the scope of the appended claims, regardless of whether they accomplish one or more of the aforementioned needs.

SUMMARY

An exemplary embodiment relates to an antenna system. The antenna system includes an M×N array having M rows and N columns for receiving antenna elements, first cards and second cards. Each of the first cards includes a radio frequency integrated circuit active feed manifold for a first polarization including active splitters/combiners. Each of the second cards includes a radio frequency integrated circuit feed manifold for a second polarization including active splitters/combiners. The first cards are each coupled to a respective one of the M rows, and the second cards are each coupled to a respective one of the N columns.

Another exemplary embodiment relates to a method of assembling an antenna array. The method includes providing a first set of cards including a first set of antenna elements and a corresponding number of integrated circuit based time delay units or phase shifters for the first set of antenna elements. The first set of antenna elements is associated with a row of the antenna array. The method also includes providing a second set of cards including a second set of antenna elements and a corresponding number of integrated circuit based time delay units or phase shifters for the second set of antenna elements. The second set of antenna elements is associated with a column of the antenna array. The method also includes providing the first and second set of cards and the second set of cards in a row and column nested arrangement.

Another exemplary embodiment relates to a manifold for an antenna array. The manifold includes first multichannel cards with active splitters/combiners arranged in rows corresponding to rows or columns of the antenna array.

Another exemplary embodiment relates to a manifold for an antenna array. The manifold includes first multichannel cards with active splitters/combiners arranged in rows corresponding to rows of the antenna array. The manifold also includes second multichannel cards with active splitters/combiners arranged in columns corresponding to columns of the antenna array.

BRIEF DESCRIPTION OF THE DRAWINGS

The invention will become more fully understood from the following detailed description, taken in conjunction with the accompanying drawings, wherein like reference numerals refer to like elements, in which:

FIG. 6 is a top planar view schematic drawing of a column card for the assembly illustrated in FIG. 5 in accordance with an exemplary embodiment;

FIG. 7 is a top planar view schematic drawing of a row card for the assembly illustrated in FIG. 5 in accordance with an exemplary embodiment;

FIG. 8 is a general block diagram of an N-way active splitter/combiner for the feed manifold illustrated in FIG. 1 in accordance with an exemplary embodiment;

FIG. 9 is a general block diagram of an N-way variable gain splitter/combiner for the feed manifold illustrated in FIG. 1 in accordance with another embodiment;

FIG. 10 is a general block diagram of an N-way variable gain splitter/combiner with phase shifters for the feed manifold illustrated in FIG. 1 in accordance with another exemplary embodiment; and FIG. 11 is a general block diagram of an N-way variable gain splitter/combiner with time delay units for the feed manifold illustrated in FIG. 1 in accordance with another exemplary embodiment.

DETAILED DESCRIPTION

Figure 1:
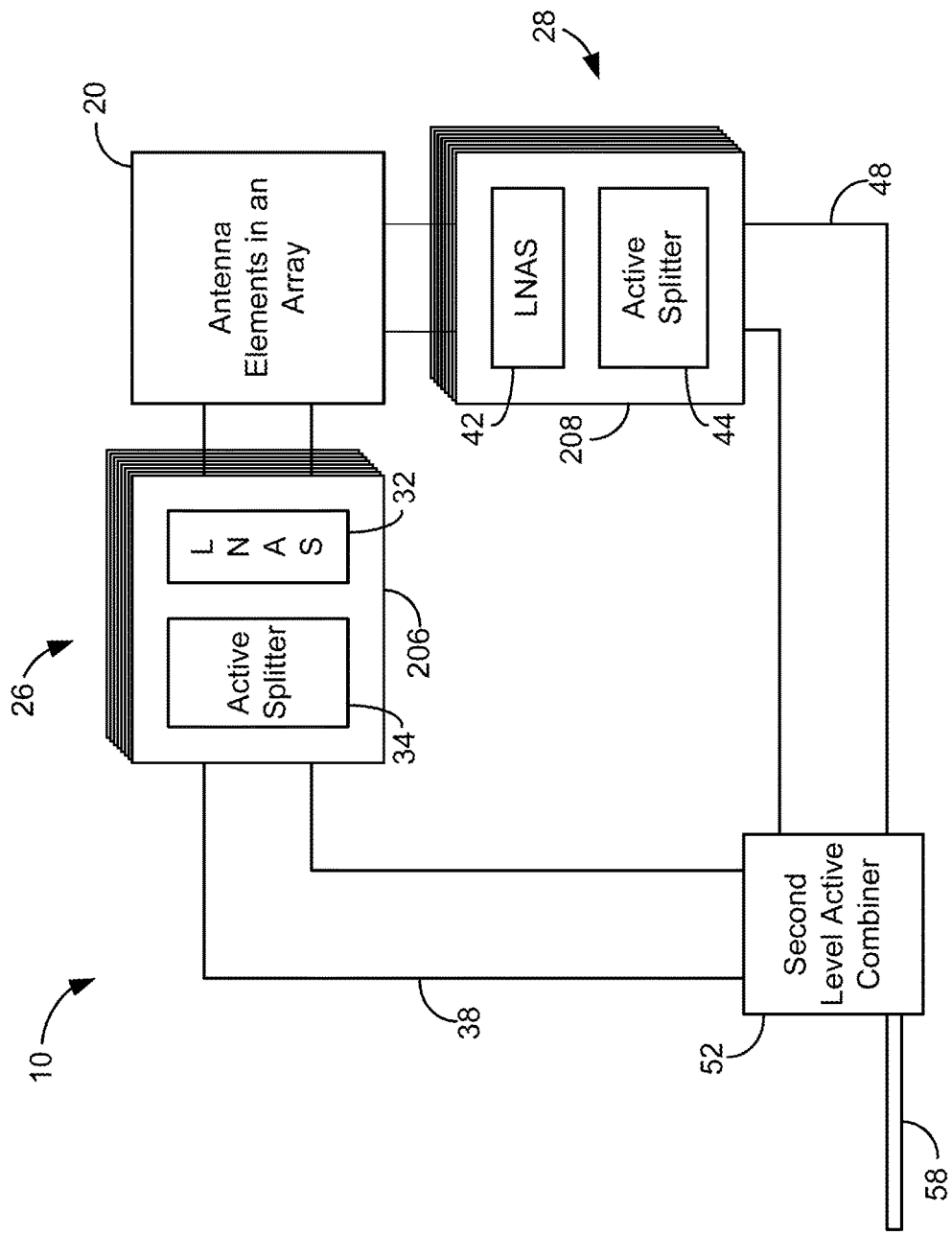
FIG. 1 is a general block diagram of a feed manifold and an antenna array in accordance with an exemplary embodiment.

Before describing in detail the particular improved system and method, it should be observed that the invention includes, but is not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Referring generally to the figures, a feed manifold for an antenna array is shown and described that may be used in radar, sensor and communications systems according to certain embodiments. The feed manifold can be used with electronically steerable antenna arrays and non-electronically steerable antenna arrays. For example, the systems and methods described can be utilized in communication, sensing and/or radar systems, such as, military radar systems or weather radar systems, electronic intelligence (ELINT) receivers, electronic counter measure (ECM) systems, electronic support measure (ESM) systems, targeting systems or other systems. In one embodiment, the systems and methods are utilized to provide an ultra-wide band (UWB) system. The steerable antenna arrays can include but are not limited to phased-array antenna systems, electronically scanned array antenna systems, or electronically scanned array (ESA) antenna systems, such as active electronically-scanned array (AESA) antenna systems.

With reference to FIG. 1, a feed manifold system 10 includes an array of antenna elements 20, a set 28 of row cards 208, a set 26 of column cards 206, and a second level splitter/combiner system 52. Feed manifold system 10 provides an interface to a transceiver. Feed manifold system 10 provides paths for signals provided to each of antenna elements 20 from the transceiver and/or from each of antenna elements 20 to the transceiver. Feed manifold system 10 provides appropriate combining, splitting, amplification, phase adjustment, and time delays for the signals associated with antenna elements 20. In one embodiment, one or more of the combining, splitting, amplification, phase adjustment, and time delay operations is performed utilizing active combiners/splitters associated with a radio frequency integrated circuit (RFIC). Feed manifold system 10 can simultaneously operate at more than one channel (e.g., a four channel system) in one embodiment.

Feed manifold system 10 can be part of a sensing system, radar system, and communication system in one embodiment. In one embodiment, system 10 can be part of an electronic intelligence (ELINT) receiver, an electronic countermeasure (ECM) system, an electronic support measure (ESM) system, and/or hybrids thereof. Feed manifold system 10 can be realized using parallel radio frequency integrated circuit subcircuits within the radio frequency integrated circuit in one embodiment.

Array of antenna elements 20 can be arranged as a one dimensional or two dimensional array of various sizes. Array of antenna elements 20 can be a M×N array, where M and N are integers and where M represents the number of rows and N represents the number of columns in one embodiment. In one embodiment, M and N can be any combination of the following integers: 4, 8, 16, 32, 64, 128 and 256. In other embodiments, M and N can be different numbers (e.g., 0, 1, 2, 12, 24, etc.) without departing from the scope of the invention. The array of elements 20 can have various shapes including but not limited to: rectangular, square, circular (radial), triangular, elliptical, etc. The aperture can be 1 dimensional, 2 dimensional, linear, planar, cylindrical, spherical, or arbitrarily single or double curved surfaces in certain embodiments.

Antenna elements 20 can be any type of radiating element or dipole for receiving or transmitting radio frequency signals. In one embodiment, antenna elements 20 are conductive components or printed circuit board patterned elements. Antenna elements 20 can be patterned (or otherwise configured) and can be positioned for a particular polarization. For example, antenna elements 20 associated with set 26 of cards 206 can be configured for vertical polarization, and antenna elements 20 associated with set 26 of cards 206 can be configured for horizontal polarization. In one embodiment, antenna elements 20 can be configured for circular polarization, elliptical polarization, etc. In one embodiment, antenna elements 20 are Balanced Antipodal Vivaldi Array (BAVA) antenna elements.

Array of antenna elements 20 can be embodied as a Balanced Antipodal Vivaldi Array aperture, or other antenna system in certain embodiments. In one embodiment, antenna elements 20 are embodied as a dual polarization array, such as, the array shown in U.S. Pat. No. 8,466, 846. U.S. Pat. No. 8,466,846 is incorporated herein by reference in its entirety.

Cards 206 are printed circuit board cards housing at least one radio frequency integrated circuit. The radio frequency integrated circuit can be a silicon germanium, gallium arsenide, indium phosphate, or a complementary metal oxide semiconductor integrated circuit configured for radio frequency operation. Various active circuits can be provided on the integrated circuit including but not limited to: power amplifiers, low noise amplifiers, variable power amplifiers, and phase shifters, transmit/receive switches, temperature sensing equipment, radio frequency (RF) power and phase delay sensing components, time delay units, digital control, interfaces, etc. in one embodiment. In one embodiment, cards 206 include active splitters/combiners 34 and low noise amplifiers 32. The term splitter as used herein refers to a splitter/combiner, a combiner or a combination splitter and combiner.

Cards 206 can include antenna elements 20 in one embodiment. Cards 206 are configured to connect with separate antenna elements 20 in rows of the array in another embodiment. Each of amplifiers 32 is coupled to each antenna element 20 in the row corresponding to each card 206 in one embodiment. Amplifiers 32 are integrated on the radio frequency integrated circuit on each card 206 in one embodiment. Amplifiers 32 are shown for use on a receive path and are not included on a transmit path in one embodiment.

Active splitters/combiners 34 are integrated on the radio frequency integrated circuit on each card 206. Active splitters/combiners 34 can include one or more of fixed amplifiers, variable gain amplifiers, phase shifters, and/or time delay units for signals on paths associated with active splitters and combiners in one embodiment. The fixed amplifiers, variable gain amplifiers, phase shifters, and/or time delay units are integrated with the active splitters/combiners 34 on the radio frequency integrated circuit in one embodiment. In one embodiment, the radio frequency integrated circuit can include the features described in U.S. application Ser. No. 14/300,055, filed on an even date herewith by West el., and entitled "Integrated Time Delay Unit System and Method for a Feed Manifold," and U.S. application Ser. No. 14/300,021, filed on an even data be West et al. herewith, and entitled "Synchronously Tuned Phase Shifter System and Method for an Array Antenna,", hereby incorporated by reference in its entireties.

Cards 208 are similar to cards 206 in one embodiment. Cards 208 are printed circuit board cards housing at least one radio frequency integrated circuit in one embodiment. The radio frequency integrated circuit can be a silicon germanium, gallium arsenide, indium phosphate, or a complementary metal oxide semiconductor integrated circuit configured for radio frequency operation. Various active circuitry can be provided on the integrated circuit including but not limited to: power amplifiers, low noise amplifiers, variable power amplifiers, and phase shifters, transmit/receive switches, temperature sensing equipment, radio frequency (RF) power and phase delay sensing components, time delay units, digital control, interfaces, etc. in one embodiment. In one embodiment, cards 208 include active splitters/combiners 44 and low noise amplifiers 42.

Cards 208 include antenna elements 20 in one embodiment. Cards 208 are configured to connect with separate antenna elements 20 in columns of the array in one embodiment. Each of amplifiers 42 is coupled to each antenna element 20 in the column corresponding to card 208 in one embodiment. Amplifiers 42 are integrated on the radio frequency integrated circuit on each card 208 in one embodiment.

Active splitters/combiners 44 are similar to active splitters/combiners 34 and are coupled to amplifiers 42 and communicate four channel signals for each card 208 at conductors 48 in one embodiment. Cards 208 can be configured along with antenna element 20 to provide four channels of horizontal polarization signals in one embodiment. The horizontal polarization signals for each card 208 are provided to second level combiner system 52 via conductors 48 in one embodiment. The connection to second layer combiner system does not require connectors. In one embodiment, soldered connections can be utilized.

Active splitters/combiners 44 are integrated on the radio frequency integrated circuit on each card 208. Active splitters/combiners 44 can include one or more of fixed amplifiers, variable gain amplifiers, phase shifters, and/or time delay units for signals on paths associated with active splitters and combiners in one embodiment. The fixed amplifiers, variable gain amplifiers, phase shifters, and/or time delay units are integrated with the active splitters/combiners 44 on the radio frequency integrated circuit in one embodiment. In one embodiment, the radio frequency integrated circuit can include the features described in U.S. application Ser. No. 14/300,055, filed on an even date herewith by West el., and entitled "Integrated Time Delay Unit System and Method for a Feed Manifold," and U.S. application Ser. No. 14/300,021, filed on an even date by West et al. herewith, and entitled "Synchronously Tuned Phase Shifter System and Method for an Array Antenna," hereby incorporated by reference in their entireties.

Second level splitter/combiner system 52 includes one or more printed circuit board cards housing at least on radio frequency integrated circuit in one embodiment. The cards for system 52 can be similar to cards 206 and 208 in one embodiment. System 52 includes active combiners/splitters similar to active splitters/combiners 34 and 44. Second level splitter/combiner system 52 provides signals to the transceiver at conductors 58 and receives signals from the transceiver at conductors 58 in one embodiment. Second level splitter/combiner system 52 provides signals to antenna elements 20 through cards 206 and 208 at conductors 38 and 48 and receives signals from antenna elements 20 through cards 206 and 208 at conductors 38 and 48 in one embodiment. In one embodiment, second level splitter/combiner system 52 provides or receives each type polarization signal for each channel at conductors 58 (e.g., in a four channel system four vertical polarization signals and four horizontal polarization signals in one embodiment). In one embodiment, second level splitter/combiner system 52 does not include passive splitters/combiners.

In one embodiment, set 28 of cards 208 includes M number of cards 208 and set 26 of cards 206 includes N number cards 206 corresponding to the M×N array of antenna elements 20 in one embodiment. Although shown with set 26 of cards 206 and set 28 of cards 208, feed manifold system 10 can be provided with only one of set 26 or set 28 for single polarization operations or a single card 206 or 208 for one dimensional operation. For example, a single set 26 of cards 206 or a single set of cards 208 arranged in one row or one column can be used with a one dimensional array of antenna elements 20. In one embodiment, set 26 of cards 206 is used to form a columnar beam former. Feed manifold system 10 can be provided with a single card 206, a single card 208, a single set 26 of cards 206 or a single set 28 of cards 208 without departing from the scope of the invention.

In one embodiment, feed manifold system 10 can employ multi-chip modules discussed in U.S. application Ser. No. 13/760,964 filed Feb. 6, 2013, Ser. No. 13/781,449, filed Feb. 4811-1880-6043. 28, 2013, and Ser. No. 13/837,934 filed Mar. 15, 2013, all of which are incorporated herein by reference in their entireties. In one embodiment, feed manifold system 10 can include components described in U.S. application Ser. No. 13/714,209 filed Dec. 13, 2012 and Ser. No. 13/737,777 filed Jan. 9, 2013, both incorporated herein by reference in their entireties. Although described as bi-directionally communicating (e.g., transmit/receive) across manifold system 10, manifold system 10 can be a unidirectional system (e.g., transmit only or receive only) without departing from the scope of the claims.

Figure 2:
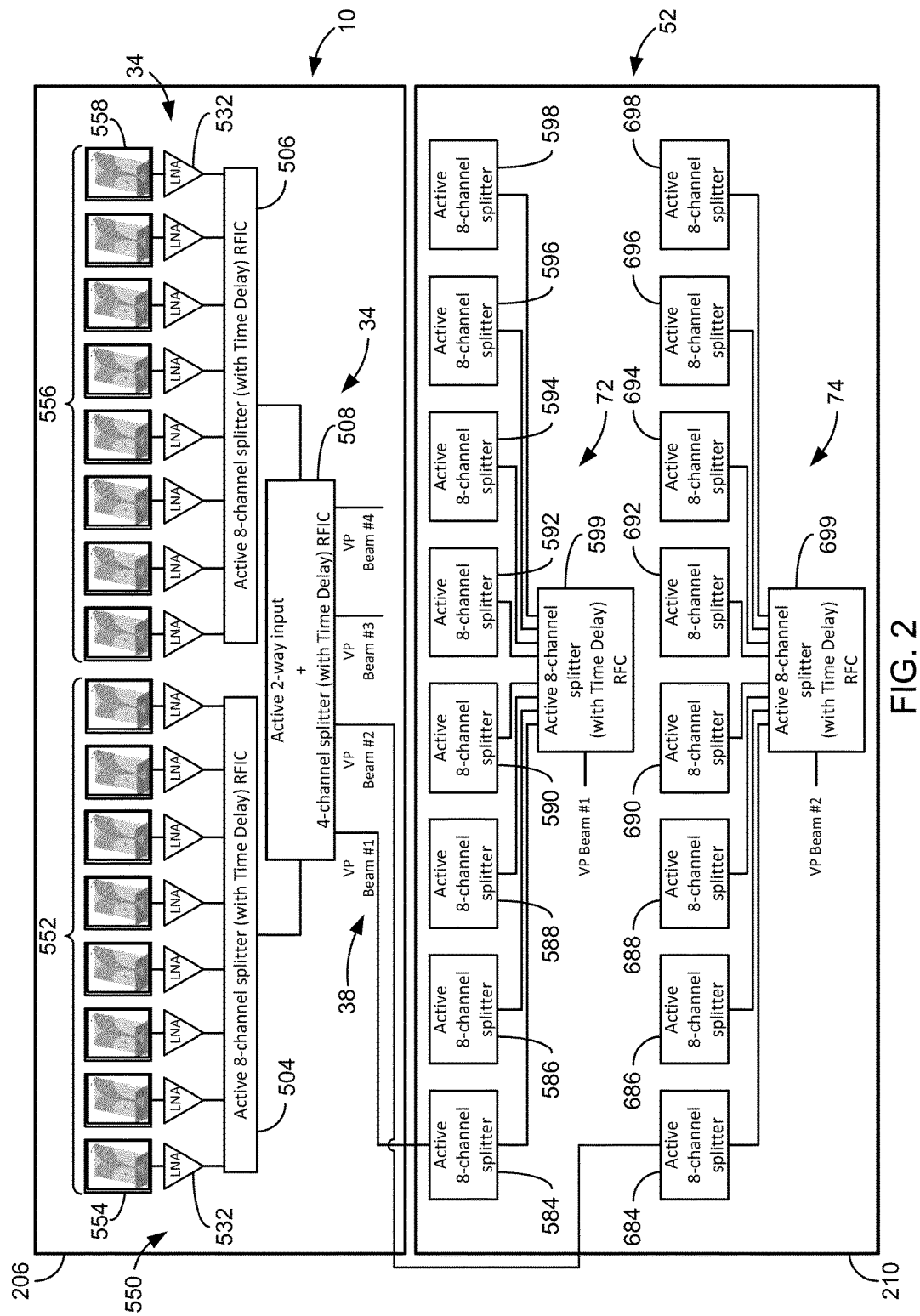
FIG. 2 is a more detailed block diagram of a portion of the feed manifold illustrated in FIG. 1, in accordance with an exemplary embodiment.
Figure 4:
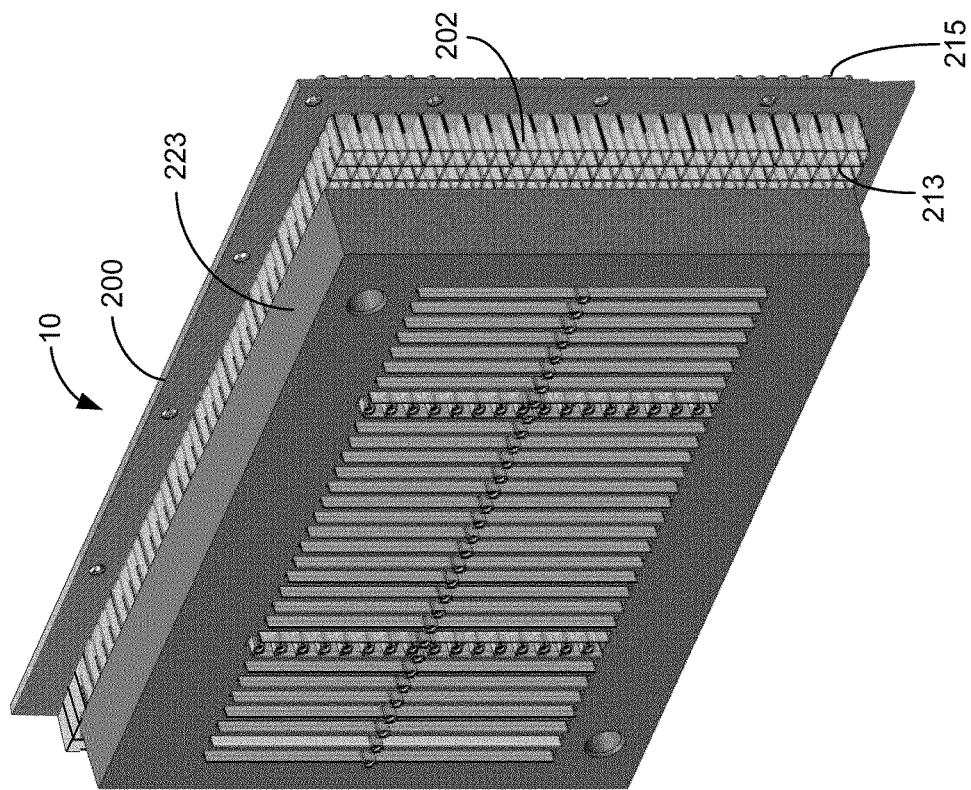
FIG. 4 is a perspective view schematic drawing showing a rear of the assembly for the manifold and antenna array illustrated in FIG. 1 in accordance with an exemplary embodiment.

With reference to FIG. 2, a portion of manifold system 10 is shown. The portion includes card 206 and a portion 210 of second level splitter combiner system 52. Active splitters/combiners 34 of card 206 include a splitter/combiner 504, a splitter/combiner 506 and a splitter/combiner 508. Portion 210 of second level splitter combiner system 52 includes a set 72 of splitters/combiners 584, 586, 588, 590, 592, 594, 596, and 598 and a set 74 of splitters/combiners 684, 686, 688, 690, 692, 694, 696 and 698 in one embodiment. In one embodiment, splitter combiner 599 is coupled to set 72 and splitter combiner 699 is coupled to set 74. Additional sets similar to sets 72 and 74 can also be provided for receiving and providing other channel signals from and to splitter/combiner 508.

Splitter/combiner 504 receives signals from and provides signals to a set 552 of eight antenna elements 554 in one embodiment. Antenna elements 554 correspond to antenna elements 20 (FIG. 1) and can be integrated with card 206 or separate from card 206. Splitter/combiner 506 receives signals from and provides signals to a set 556 of eight antenna elements 558 in one embodiment. Antenna elements 558 correspond to antenna elements 20 (FIG. 1) and can be integrated with card 206 or separate from card 206. Although an eight channel configuration is discussed above, other numbers of channels can be utilized without departing from the scope of the invention.

A set 550 of low noise amplifiers 532 (e.g., corresponding to amplifiers 32 in FIG. 1) can be provided between splitters/combiners 504 and 506 and respective elements 554 and 558 in one embodiment. Splitters/combiners 504 and 506 can each be an active eight-channel splitter/combiner in one embodiment. Splitters/combiners 504 and 506 can each include one or more of a fixed amplifier, a variable gain amplifier, a phase shifter (e.g., vector modulated phase shifter), and/or a time delay unit in one embodiment.

Splitter/combiners 504 and 506 are coupled to splitter/combiner 508 which provides channel signals at conductors 38. Splitter/combiner 508 can be an active two way input plus four channel splitter in one embodiment. Splitters/combiner 508 can include one or more of a fixed amplifier, a variable gain amplifier, a phase shifter (e.g., vector modulated phase shifter), and/or a time delay unit in one embodiment. Splitter/combiners 504, 506, and 508 can be integrated on the same radio frequency integrated circuit on card 206 in one embodiment.

Splitters/combiners 582, 584, 586, 588, 590, 592, 594, 596, 598, 599, 682, 684, 686, 688, 690, 692, 694, 696, 698 and 699 are active splitters/combiners. Splitters/combiners 582, 584, 586, 588, 590, 592, 594, 596, 598, 599 682, 684, 686, 688, 690, 692, 694, 696, 698 and 699 can be 8 channel splitters/combiners and include one or more of a fixed amplifier, a variable gain amplifier, a phase shifter (e.g., vector modulated phase shifter), and/or a time delay unit in one embodiment.

Other cards in set 26 can be coupled to second splitter/combiner system 52 in a similar manner. Cards 208 in FIG. 1 can be similarly coupled to second level combiner/splitter system 52 as described with respect to card 206 in FIG. 2. The number of channels and splitters/combiners described in FIG. 2 are not shown or described in a limiting fashion. Any number of channels and splitters/combiners can be utilized depending upon system criteria and performance requirements.

Figure 3:
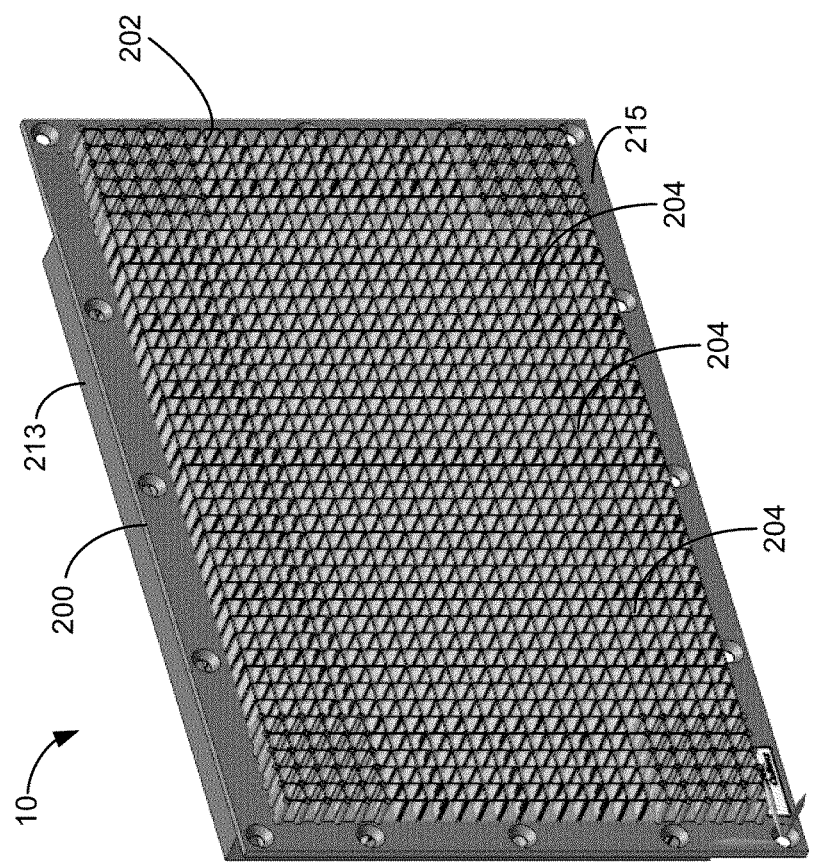
FIG. 3 is a perspective view schematic drawing showing a front of an assembly for the manifold and antenna array illustrated in FIG. 1 in accordance with an exemplary embodiment.

With reference to FIG. 3, feed manifold system 10 can be packaged in an assembly 200 for housing cards 206, cards 208 and second level combiner/splitter system 52. In one embodiment, assembly 200 includes a modular section 202. Modular section 202 can include an array of cells 204 arranged in a lattice structure in one embodiment. Cells 204 can be any shape including but not limited to square, rectangular, circular, elliptical etc. Cells 204 can be arranged in an egg crate configuration.

In one embodiment, cells 204 are configured to receive antenna elements 20 (FIG. 1). In one embodiment, each cell 204 can receive two elements 20 (FIG. 1), one for a first type polarization and one for a second type polarization. Elements 20 can be received through a rear side 213 and disposed at a front side 215.

Assembly 200 provides an integrated aperture and feed utilizing integrated strip line printed circuit cards (e.g., cards 206 and 208) in one embodiment. In one embodiment, modular section 202 can be an array lattice having a dimension of $\lambda_{HF}/2$ in both planes where HF is the highest frequency of the array intended bandwidth. In one embodiment, the height can be less than $\lambda_{HF}/2$. Assembly 200 can provide a conical scan of plus or minus 45 degrees for a planar BAVA aperture with a 10:1 instantaneous bandwidth according to one exemplary embodiment. A thermal chassis 223 can be provided on a back side 213 of assembly 200.

Figure 5:
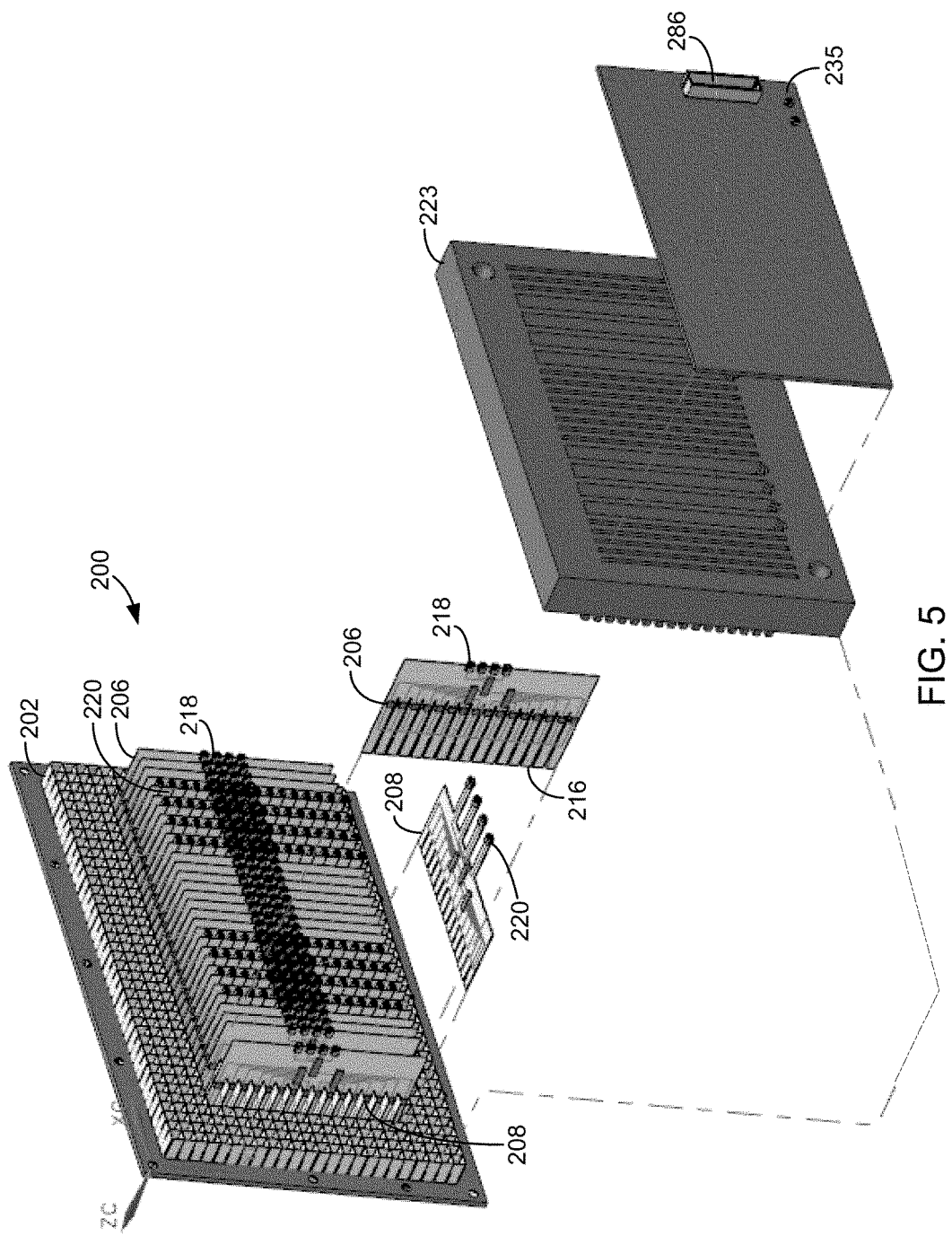
FIG. 5 is an exploded perspective view schematic drawing of the assembly illustrated in FIG. 3 in accordance with an exemplary embodiment.

With reference to FIG. 5, assembly 200 includes section 202, cards 206, cards 208, thermal chassis 223 and a second level splitter/combiner cover 235. Cards 206 are provided in columns associated with section 202, and cards 208 are provided in rows of section 202 in one embodiment. Thermal chassis 223 fits over cards 206 and 208 in one embodiment. Cover 235 is optional and can house one or more circuit boards for second level splitter/combiner system 52 (FIG. 1). Cover 235 can include a connector 286 for conductors 58 (FIG. 1).

Cards 206 can be vertical polarization four beam (e.g., channel) ESA cards including active silicon germanium splitters/combiners with phase shifters or time delay units in one embodiment. Cards 206 do not contain passive binary splitters/combiners in one embodiment. Cards 206 can be radio frequency printed circuit boards with simple transmission lines interconnecting the RFIC feed manifold. Cards 206 include radio frequency transmission line (T-line) connectors, interconnects or contacts 218 in one embodiment.

Cards 208 can be horizontal polarization four beam (e.g., channel) ESA cards including active silicon germanium splitters/combiners with phase shifters or time delay units in one embodiment. Alternatively, different polarization types (e.g., circular polarization) can be utilized. Cards 208 do not contain passive binary splitters/combiners in one embodiment. Cards 208 can be radio frequency printed circuit boards with simple transmission lines interconnecting the radio frequency integrated circuit feed manifold. Cards 208 include radio frequency transmission line (T-line) connectors or contacts 220 in one embodiment. Two cards 208 are provided in each row of section 202 in one embodiment.

Cards 206 and 208 are configured to be in a nested configuration with respect to each other when provided in assembly 200. In one embodiment, cards 206 include grooves 216 for sliding over cards 208 such that a compact arrangement can be achieved. Advantageously, assembly 200 is compact in a depth dimension due to the nested arrangement of cards 206 and 208.

Interconnects or contacts 218 and 220 extend through thermal chassis 223 in one embodiment. Interconnects or contacts 218 and 220 form a double cross pattern that can be coupled a similar pattern of connectors on cover 235 in one embodiment. The connectors on cover 235 are coupled to second level splitter combiner system 52 (FIG. 1) in one embodiment.

With reference to FIG. 6, card 206 includes a set 550 of low noise amplifiers 532, active combiner/splitter 504, active combiner/splitter 506, active combiner/splitter 508 and contacts or transmission line interconnects or contacts 218. In one embodiment, card 206 includes set 552 of elements 554 and set 556 of elements 558. Active combiner/splitters 504, 506 and 508 can be provided on a single integrated circuits or on separate integrated circuits. Antenna elements 554 and 558 can correspond to elements 20 (FIG. 1).

In one embodiment, elements 554 and 558 are provided in assembly 202 and cards 206 connect to elements 554 and 558. In one embodiment, elements 554 and 558 are integral with cards 206. Each of elements 554 is associated with a respective one of low noise amplifier 502.

With reference to FIG. 7, card 206 includes a set 650 of low noise amplifiers 612, an active combiner/splitter 604, an active combiner/splitter 606, an active combiner/splitter 608 and contacts or transmission line interconnects 220. Combiners/splitters 604, 606, and 608 are similar to combiners/splitters 504, 506, and 508 (FIGS. 2 and 6). Combiners/splitters 604, 606 and 608 can be on a single integrated circuit or on separate integrated circuits. In one embodiment, card 208 includes set 652 of antenna elements 654 and set 656 of elements 658. Elements 654 and 658 are similar to elements 554 and 558 (FIGS. 2 and 6).

Antenna elements 654 and 658 can correspond to elements 20 (FIG. 1). In one embodiment, the polarization of elements 654 and 658 is different than polarization for elements 554 and 558 (e.g., elements 654 and 658 are configured to horizontal polarization and elements 554 and 558 are configured for vertical polarization) in one embodiment.

In one embodiment, elements 554, 558, 654, and 658 are provided in assembly 202 and cards 206 and 208 respectively connect to elements 554 and 558 and elements 654, and 658. In one embodiment, elements 554, 558, 654, and 658 are integral with cards 206 and 208 and provided on fingers separated by slots. The fingers engage cells 204 when cards 206 and 208 are installed on section 202 (FIG. 3) of assembly 200 in one embodiment.

Card 206 includes extended legs 620 for connecters or contacts 220 in one embodiment. Extended legs 620 ensure that contacts 218 of card 206 and contacts 220 or card 208 are provided in a same plane for connection via cover 235 in one embodiment when card 206 slides over card 208.

With reference to FIG. 8, a splitter/combiner 900 can include a set of fixed amplifiers 902. In one embodiment, splitter/combiner 900 is for use in a system with moderate band width or ultra-wide bandwidth, fixed aperture excitation without scanning.

With reference to FIG. 9, an active splitter/combiner 904 can include a set of variable gain amplifiers 906. In one embodiment, splitter/combiner 906 is for use in a system with moderate band width or ultra-wide bandwidth, variable aperture excitation without scanning With reference to FIG. 10, an active splitter/combiner 908 can include a set of variable gain amplifiers 910 and a set of phase shifters 912. In one embodiment, splitter/combiner 908 is for use in a system with moderate band width, variable aperture excitation with electronic scanning.

With reference to FIG. 11, an active splitter/combiner 920 can include a set of variable gain amplifiers 924 and a set of integrated time delay units 926. In one embodiment, splitter/combiner 920 is for use in a system with moderate band width, variable aperture excitation with electronic scanning.

In one embodiment, splitters/combiners 900, 904, 908 and 920 are active eight way splitters/combiners. In one embodiment, splitters/combiners 900, 904, 908 and 920 can be used as splitters/combiners 504, 506, 508, 604, 606, and 608, 584, 586, 588, 590, 592, 594, 596, 598, 599, 684, 686, 688, 690, 692, 694, 696, 698, and 699. Splitters/combiners 900, 904, 908 and 920 can be provided utilizing bi-polar silicon germanium, radio frequency complementary metal oxide semiconductor (RF CMOS), and indium phosphate semiconductor technologies and micro strip technologies.

Although discussed with respect to various splitter/combiner sizes and array sizes, the splitter/combiner sizes and array sizes are not discussed in a limiting fashion. Large feed manifold for M×N two dimensional AESA structures can be built with multiple active combiner integrated circuits connected through printed circuit board interconnects in one embodiment.

By miniaturizing feed manifold system 10 using cards 206 and 208, multiple channels or beams can be achieved in one embodiment. Feed manifold system 10 with active devices replaces large, high isolation Wilkinson combiners and/or reactive-T passive splitters/combiners in one embodiment. In addition, the use of active splitters/combiners allows the use of amplifiers to provide variable gain each channel to reduce radio frequency system losses and provide amplitude tapering for low side band active electronic scanning array design. In addition, the active circuitry allows integration of phase shifters or time delay units for one dimensional and two dimensional beam scanning. In one embodiment, the active circuitry can enable intermediate frequency based AESA manifold. In one embodiment, mixer circuitry is integrated with the active combiners and splitters.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. An antenna system, comprising:
    an M×N array configured to receive antenna elements;
    a plurality of first cards, each first card being one unitary piece and comprising a radio frequency integrated circuit active feed manifold for a first polarization comprising first antenna elements of the antenna elements and a plurality of first integrated circuits packages for an active splitter/combiner, and the first cards comprising printed circuits board paths interconnecting the first integrated circuit packages and the first antenna elements; and
    a plurality of second cards, each second card being one unitary piece and comprising a radio frequency integrated circuit active feed manifold for a second polarization comprising second antenna elements of the antenna elements and a plurality of second integrated circuit packages for an active splitter/combiner, the second cards comprising printed circuit board paths interconnecting the second integrated circuit packages and the second antenna elements, wherein the first cards are each disposed in a respective one of M rows of the M×N array and the second cards are each disposed in a respective one of N columns of the M×N array, wherein the first cards and second cards each have a first edge proximate the M×N array and a second edge opposite the first edge, the second edge being offset from the M×N array.

2. The system of claim 1, wherein a dimension from a front of the antenna elements to a back of the cards is less than 4 inches.

3. The system of claim 2, further comprising a chassis coupled to connectors disposed on the back of the first cards and the second cards.

4. The system of claim 1, wherein the first cards include slots configured to slide over the second cards, wherein connectors on the second cards are disposed on extended legs, wherein the extended legs extend to a position planar with a back of the first cards.

5. The system of claim 4, wherein the first cards are row cards and the second cards are column cards.

6. The system of claim 5, wherein the extended legs have a width less than a distance between two neighboring first cards.

7. The system of claim 6, wherein the first cards and second cards comprise a plurality of low noise amplifiers, a multichannel active combiner, and a transmission line interconnect.

8. The system of claim 7, wherein the first and second cards do not include passive binary splitters or combiners.

9. The system of claim 1, wherein the first antenna elements are disposed at the first edge of the first cards, and the second antenna elements are disposed at the first edge of the second cards.

10. A method of assembling an antenna array, the method comprising:
    providing a first set of cards comprising a first set of antenna elements and a corresponding number of integrated circuit based time delay units or phase shifters for the first set of antenna elements, the first set of antenna elements being associated with a row of the antenna array, the first set of cards comprising printed circuit board paths interconnecting the first set of antenna elements and integrated circuit packages for the integrated circuit based time delay units or phase shifters;
    providing a second set of cards comprising a second set of antenna elements and a corresponding number of integrated circuit based time delay units or phase shifters for the second set of antenna elements, the second set of antenna elements being associated with a column of the antenna array; and
    providing the first set of cards and the second set of cards in a row and column nested arrangement.

11. The method of claim 10, wherein first set of cards and second set of cards each comprise a set of low noise amplifiers, a plurality of multichannel active combiners, and an interconnect.

12. The method of claim 10, wherein the antenna array is an ultra-wide band array.

13. The method of claim 11, wherein the antenna elements are a part of a Balanced Antipodal Vivaldi Array.

14. The method of claim 12, wherein the antenna array is a two dimensional array.

15. The method of claim 10, the antenna array is rectangular.

16. The method of claim 10, wherein the first and second sets of cards are integrated strip line cards.

17. The method of claim 10, wherein the first set of antenna elements are polarized in a first orientation and the second set of the antenna elements are polarized in a second orientation.

18. A manifold for an antenna array, the manifold comprising:
    a section piece having a row of first elements in a first plane;
    a plurality of first multichannel cards with an active splitter/combiner, the first multichannel cards being arranged in rows corresponding to rows of the antenna array, wherein the first multichannel cards engage the first elements and are disposed at an angle with respect to the first plane, wherein connectors are disposed on an edge of the first multichannel channel cards, the edge being offset from the first plane, wherein the first multichannel cards each comprise printed circuit board paths interconnecting antenna elements integrated with the first multichannel card and integrated circuit packages integrated with the first multichannel card and associated with the active splitter/combiner.

19. The manifold of claim 18, further comprising:
    a plurality of second multichannel cards, with an active splitter/combiner, the second multichannel cards being arranged in columns corresponding to columns of the antenna array.

20. The manifold of claim 18, wherein the antenna array is BAVA array having a frequency range between 0.25 gigahertz and 20 gigahertz, wherein the first and second multichannel cards comprise time delay units or phase delay circuits.

* * * * *